United States Patent [19]

Peterman et al.

[11] Patent Number: 4,855,252
[45] Date of Patent: Aug. 8, 1989

[54] PROCESS FOR MAKING SELF-ALIGNED CONTACTS

[75] Inventors: Steven Peterman; David Stanasolovich, both of Manassas, Va.

[73] Assignee: International Business Machines Corporation, Armonk, N.Y.

[21] Appl. No.: 234,780

[22] Filed: Aug. 22, 1988

[51] Int. Cl.⁴ ............................................. H01L 21/88
[52] U.S. Cl. .................................. 437/189; 437/194; 437/228
[58] Field of Search ............... 437/189, 190, 194, 228, 437/189, 194; 148/DIG. 75

[56] References Cited

U.S. PATENT DOCUMENTS

| | | | |
|---|---|---|---|
| 4,315,984 | 2/1982 | Okazaki et al. | 437/187 |
| 4,392,298 | 7/1983 | Barker et al. | 437/194 |
| 4,512,073 | 4/1985 | Hsu | 29/571 |
| 4,520,041 | 5/1985 | Aoyama et al. | 437/228 |
| 4,523,976 | 6/1985 | Bukhman | 156/643 |
| 4,544,445 | 10/1985 | Jeuch et al. | 156/643 |
| 4,614,021 | 9/1986 | Hulseweh | 437/199 |
| 4,646,426 | 3/1987 | Sasaki | 29/571 |
| 4,661,204 | 4/1987 | Mathur et al. | 437/189 |
| 4,700,465 | 10/1987 | Sirkin | 437/20 |
| 4,797,375 | 1/1989 | Brownell | 437/189 |

FOREIGN PATENT DOCUMENTS

| | | | |
|---|---|---|---|
| 0096752 | 6/1983 | Japan | 437/194 |
| 0192350 | 11/1983 | Japan | 437/194 |
| 0055038 | 3/1984 | Japan | 437/194 |
| 0236248 | 11/1985 | Japan | 437/189 |
| 0246649 | 12/1985 | Japan | 437/194 |
| 0094345 | 5/1986 | Japan | 437/194 |
| 0187346 | 8/1986 | Japan | 437/194 |

Primary Examiner—Brian E. Hearn
Assistant Examiner—Tuan Nguyen
Attorney, Agent, or Firm—Jesse L. Abzug

[57] ABSTRACT

A process for making metal contacts and interconnection lines which are self-aligned to each other is disclosed. After semiconductor devices are formed and an insulating/planarizing layer is deposited, a layer of polyimide is deposited. A pattern of trenches into which the metal interconnection lines will be deposited is formed in the polyimide layer. Next, a pattern of contacts to the underlying semiconductor devices is formed in a photoresist layer. This pattern of contacts is subsequently etched into the insulating/planarizing layer. Since both the patterned photoresist layer and the patterned polyimide layer are used as etch masks, the contact windows through the insulating/planarizing layer and the trenches in the polyimide layer will be aligned with respect to each other. After metal deposition, the metal contacts and interconnection lines will be self-aligned.

9 Claims, 2 Drawing Sheets

CA RESIST ON POLYIMIDE
▨ – POLYIMIDE ONLY
▦ – CA RESIST ONLY
☐ – CONTACT AREA

PROCESS FOR MAKING SELF-ALIGNED CONTACTS

BACKGROUND INFORMATION

1. Field of the Invention

This process relates generally to the fabrication of integrated circuits. In particular, a process for making metal contacts self-aligned to interconnecting metallurgy is described.

2. Background of the Invention

As manufacturers reduce the dimensions of integrated circuits, it is readily apparent that one of the greatest barriers to achieving sub-micron geometries is the area allotted to alignment or overlay tolerances which are required to assure adequate connections between metal contacts to the semiconductor devices themselves and the interconnecting metallurgy. An alignment or overlay tolerance allows for small errors in the alignment of photomasks used for patterning various layers without compromising the adequacy of the connections between the layers.

To better appreciate the problems encountered, as example of a prior art metal line and contact structure is shown in FIG. 1. As conventionally done in semiconductor processing, the contacts 10 to the semiconductor devices are first formed, and then in subsequent processing steps, the interconnecting metallurgy 12 is deposited. With the current limitations of conventional optical lithography tools, which have a standard overlay error of approximately 0.45 microns, in order to ensure that one micron wide lines 12 completely overlay the contacts 10, it is necessary that the contacts have a width of approximately 2 microns. Obviously, if one could eliminate the extra one micron border on the contact, as shown in FIG. 2, the ability to increase the maximum wiring density of metal lines 12 would be greatly improved.

OBJECTS OF THE INVENTION

It is therefore a principal object of this invention to provide a process for making contacts that are self-aligned to metal lines.

It is a further object of this invention to provide a process for making contacts and metal lines using well-known semiconductor processes which do not increase process complexity.

SUMMARY OF THE INVENTION

In accordance with these objects, and others which are readily apparent, a process is provided for making self-aligned metal lines and contact metallurgy through an insulating/planarizing layer to make contact with semiconductor devices previously formed. The essential process steps include:

a. depositing a layer of polyimide over the insulating layer;

b. depositing a layer of photoresist over the polyimide layer;

c. lithographically defining a wiring pattern in the layer of photoresist and transferring that pattern into the polyimide layer;

d. depositing a second layer of photoresist;

e. lithographically defining a pattern of contacts in the layer of resist and transferring that pattern into the insulating layer; and f. depositing a layer of metal which formed the contact studs and interconnect wiring.

BRIEF DESCRIPTION OF THE DRAWINGS

The foregoing and other advantages of the invention will be more fully understood with reference to the description of the preferred embodiment and with reference to the drawings herein.

DESCRIPTION OF THE PREFERRED EMBODIMENT

Figure 1:
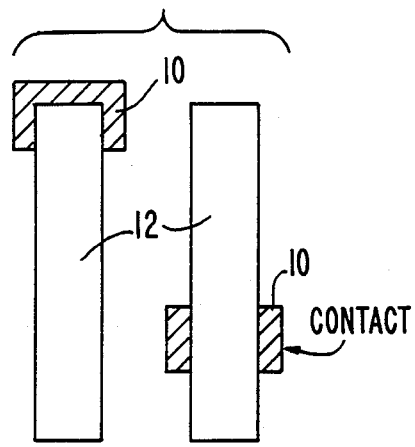
FIG. 1 is an exploded top view of a semiconductor wafer showing metal lines and contacts as formed in the prior art.
Figure 2:
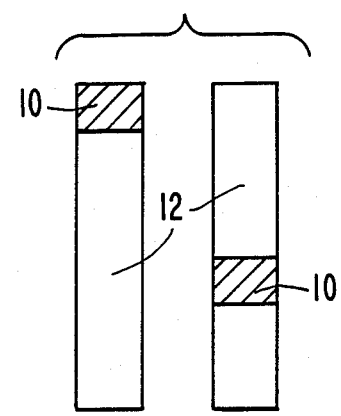
FIG. 2 shows an exploded top view of a semiconductor wafer showing metal lines and contacts formed according to the invention disclosed herein.
Figure 3:
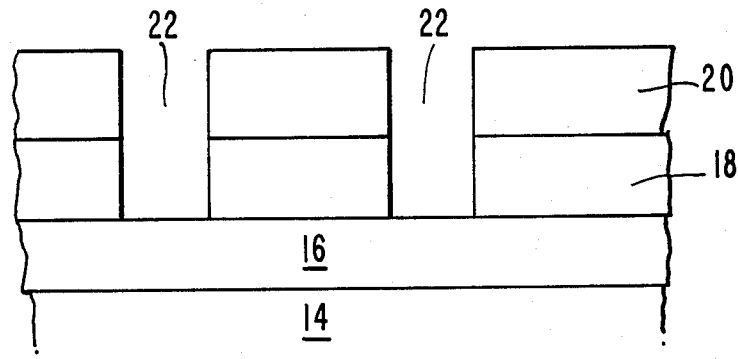
FIGS. 3-5 show cross-sectional views of a semiconductor wafer at various processing steps according to the method of this invention.

Referring to FIG. 3, a semiconductor substrate is shown as reference numeral 14. In the preferred embodiment, substrate 14 is a silicon wafer, but it will be understood by those skilled in the art that substrate 14 could be made of gallium arsenide or other substrates commonly used for making integrated circuits. Previously fabricated in substrate 14 are a plurality of semiconductor devices such as FET transistors or bipolar transistors (not shown). The structures and processes used to make these semiconductor devices are not part of the invention herein described.

Overlying substrate 14 is a planarizing/insulating layer 16 of borophosphosilicate glass (BPSG). The purpose of the BPSG layer 16 is to insulate the substrate 14 from the metal interconnect lines to be deposited in later processing steps, and also to provide a planar surface upon which the metal is to be deposited. A planar surface is important to ensure that the brittle metal lines will not be easily cracked. To achieve this planarity, a minimum thickness of 6000 Angstroms is required over the highest point on the substrate 14. In alternative embodiments, the insulating/planarizing layer 16 can be comprised of doped or undoped silicon oxide, silicon nitride, phosphosilicate glass, etc. The deposition of layer 16 can be by conventional atmospheric pressure chemical vapor deposition (APCVD) or low pressure chemical vapor deposition (LPCVD).

Next, a layer of polyimide 18 is formed. Liquid polyamic acid is spun on the substrate 14 and then baked at 120° C. for twenty minutes; 200° C. for twenty minutes; and 350° C. for twenty minutes. The final thickness of the polyimide should be the approximate thickness of the interconnection metallurgy to be deposited, between 0.5 and 1.5 microns. Alternatively, any insulator which has different etch characteristics from layer 16, such as spun on glass or other organic compounds, can be used in place of the polyimide.

On top of the polyimide layer 18, a 2.0 micron thick layer of positive diazonovolak or other positive resist is deposited. Preferably, the thickness of the resist 20 should be approximately twice the thickness of the polyimide layer 18. The photoresist layer 20 is then exposed using standard optical or x-ray lithographic tools through a mask (not shown) having the interconnection metallurgy pattern defined. The exposed photoresist is then developed in 0.17N KOH or equivalent for other exposure techniques to open up the trenches 22 in photoresist layer 20.

Photoresist layer 20 is then used as an etch mask and the pattern of trenches 22 is transferred to the polyimide layer 18. This transfer is performed in a reactive ion etch tool using oxygen as the etch gas. The etching parameters are as follows:
etch gas - $O_2$
pressure - 10 mtorr
watts - 750
time - laser endpoint detection plus 20% overetch Upon conclusion of the etching process, the trenches 22 extend throughout both the photoresist layer 20 and the polyimide layer 18. The photoresist layer 20 is stripped using a wet chemical solvent, such as N-methylpyrrolidone.

Figure 4:
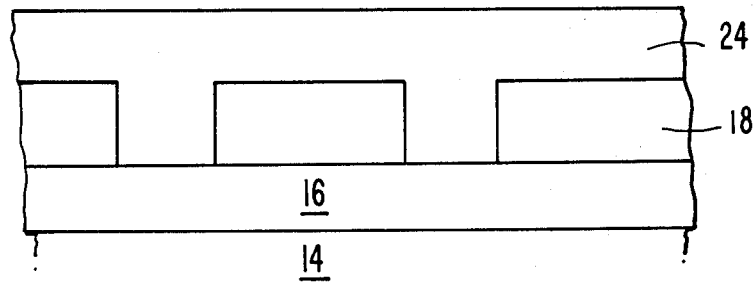

Referring now to FIG. 4, a second layer of positive diazonovolak photoresist 24 is spun on to a thickness of approximately 1.6–2.0 microns, and then baked for fifteen minutes at 95° C. The photoresist layer 24 is then exposed using conventional exposure tools through a mask having a pattern of contacts to substrate 14. Following exposure, the photoresist 24 is then baked at 95° for fifteen minutes. The developed photoresist layer 22 is shown in FIG. 5.

Figure 5:
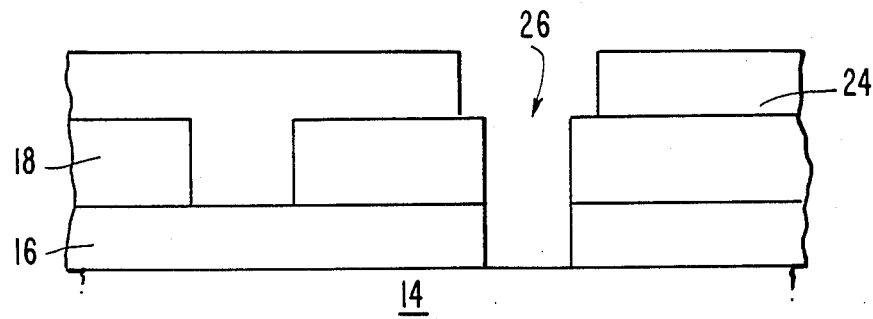

Next, the contact pattern is etched into the polyimide layer 18 and the BPSG layer 16 in a reactive ion etch tool with the following parameters:
etch gas - 8% $O_2$ in $CHF_3$
pressure - 50 mtorr
power - 1400 watts
time - endpoint plus 20% overetch The resulting window 26 can be seen in FIG. 5. The photoresist layer 24 is then stripped using a wet chemical solvent.

Figure 6:
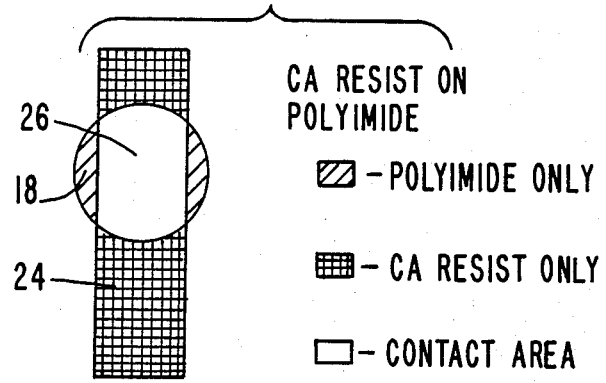
FIG. 6 shows an exploded top view of a metal line and contact.

Referring to FIG. 6, since the contact window 26 was etched into the BPSG layer using both the photoresist layer 24 and the polyimide layer 18 as etch masks, the contact through the BPSG layer 16 will coincide precisely with the trench 22 which was previously defined to be the area for the metal interconnect lines. The result is a self-aligned contact to metal line structure.

Figure 7:
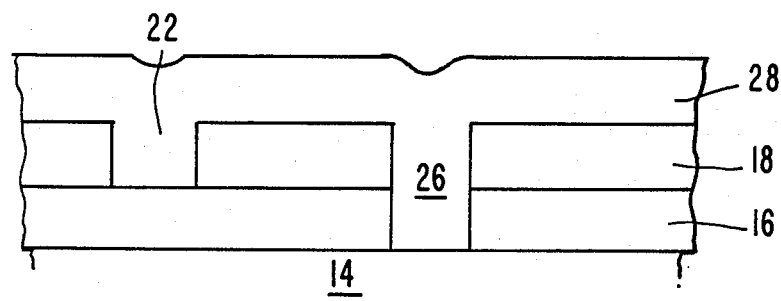
FIGS. 7-9 show cross-sectional views of a semiconductor wafer at various stages of processing.
Figure 8:
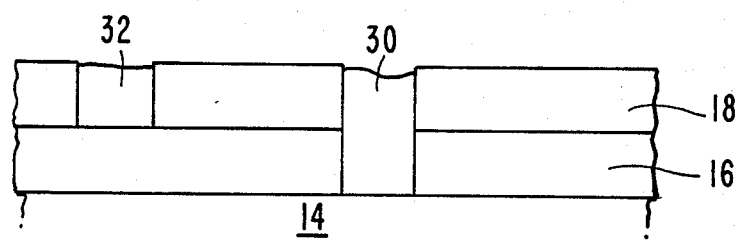
Figure 9:
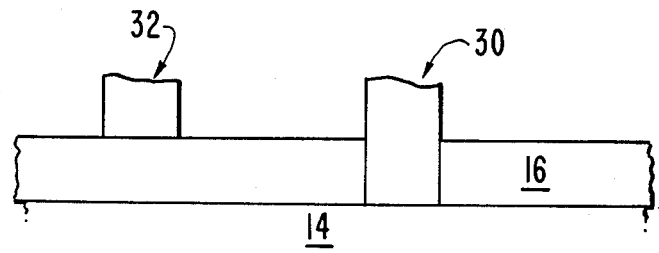

Referring now to FIG. 7, a layer of metallurgy 28 is conformally deposited using evaporating or sputtering techniques. The interconnection metallurgy can be any material conventionally used for such purposes including, but not limited to, aluminum, polysilicon, copper, silicon, titanium, tungsten, silver, gold, or alloys or composites thereof. The thickness of the metal over the polyimide layer 18 is preferably 2½ times the radius of the contact window 26. In this preferred embodiment, the thickness of the metal 28 is 1.5 microns. As can be seen in FIG. 7, the metal 28 fills the contact window 26 creating a contact stud and also fills the window 22 where the interconnection metallurgy is desired. The metal layer 28 is then blanket etched to the surface of polyimide layer 18 in a reactive ion etcher using the following parameters:
etch gas - $Cl_2$-$BCl_3$
power - 500–850 watts
time - laser or spectrophotometric endpoint The resulting structure can be seen in FIG. 8. The polyimide layer 18 is then removed in an oxygen etch leaving the metal structures 30 and 32 as seen in FIG. 9.

Further processing, such as insulator deposition and fabrication of additional layers is then performed.

While the invention has been disclosed with reference to a preferred embodiment, it would be apparent to those skilled in the art that various changes to the process can be made without departing from the spirit and scope of the invention. Accordingly, the invention shall only be limited in accordance with the following claims.

We claim:

1. In an integrated circuit having a plurality of semiconductor devices fabricated on a substrate, a process for interconnecting the semiconductor devices comprising the following steps in the following order:
   A. depositing an insulating layer over said semiconductor devices;
   B. depositing a layer of polyimide over said insulating layer;
   C. depositing a first layer of photoresist over said polyimide layer;
   D. lithographically defining an interconnect wiring pattern in said first layer of photoresist;
   E. dry etching said interconnect wiring pattern into said polyimide layer;
   F. depositing a second layer of photoresist over said patterned polyimide layer;
   G. lithographically defining a pattern of contacts in said second layer of photoresist, said pattern of contacts overlying said patterned polyimide layer;
   H. transferring said pattern of contacts to said insulating layer; and
   I. depositing a layer of interconnect wiring, said interconnect wiring layer filling said pattern of contacts in said insulating layer and said interconnect wiring pattern in said polyimide layer.

2. The process as claimed in claim 1 including the step of removing said polyimide layer after depositing said interconnect wiring layer.

3. The process as claimed in claim 1 wherein said insulating layer is borophosphosilicate glass.

4. The process as claimed in claim 1 wherein said interconnect wiring layer is selected from the group consisting of aluminum, copper, silicon, titanium, tungsten, silver, gold or alloys or composites thereof.

5. The process as claimed in claim 1 wherein said interconnect wiring layer is deposited by evaporation or sputtering.

6. A process for interconnecting semiconductor devices comprising the following steps in the following order:
   A. providing a semiconductor substrate having a plurality of semiconductor devices formed therein;
   B. depositing an insulating layer over said semiconductor devices on said substrate;
   C. depositing a thin layer of polyamic acid over said insulating layer;
   D. curing said polyamic acid to form a layer of polyimide;
   E. depositing a first layer of photoresist over said polyimide layer;
   F. exposing said first layer of photoresist to optical or X-ray radiation through a mask defining an wiring pattern;
   G. developing said first layer of photoresist;
   H. etching said interconnect wiring pattern into said polyimide layer;
   I. removing said first layer of photoresist;
   J. depositing a second layer of photoresist over said patterned polyimide layer;

K. lithographically defining a pattern of contacts in said second layer of photoresist, said pattern of contacts aligned with and overlying said patterned polyimide layer;

L. transferring said pattern of contacts to said insulating layer;

M. removing said second layer of photoresist; and

N. conformally depositing a layer of interconnect wiring, said interconnect wiring layer filling said pattern of contacts in said insulating layer and said interconnect wiring pattern in said polyimide layer.

7. The process as claimed in claim 6 including the step of removing said polyimide layer after depositing said interconnect wiring layer.

8. The process as claimed in claim 6 wherein said insulating layer is borophosphosilicate glass.

9. The process as claimed in claim 6 wherein said interconnect wiring layer is selected from the group consisting of aluminum, copper, silicon, titanium, tungsten, silver, gold or alloys or composites thereof.

* * * * *